(12) United States Patent
Na et al.

(10) Patent No.: US 8,373,097 B2
(45) Date of Patent: Feb. 12, 2013

(54) APPARATUS FOR THERMALLY PROCESSING SUBSTRATE

(75) Inventors: Heung-Yeol Na, Yongin (KR); Min-Jae Jeong, Yongin (KR); Jong-Won Hong, Yongin (KR); Eu-Gene Kang, Yongin (KR); Seok-Rak Chang, Yongin (KR); Ki-Yong Lee, Yongin (KR); Jin-Wook Seo, Yongin (KR); Tae-Hoon Yang, Yongin (KR); Yun-Mo Chung, Yongin (KR); Byung-Soo So, Yongin (KR); Byoung-Keon Park, Yongin (KR); Dong-Hyun Lee, Yongin (KR); Kil-Won Lee, Yongin (KR); Won-Bong Baek, Yongin (KR); Jong-Ryuk Park, Yongin (KR); Bo-Kyung Choi, Yongin (KR); Ivan Maidanchuk, Yongin (KR); Jae-Wan Jung, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 406 days.

(21) Appl. No.: 12/713,982

(22) Filed: Feb. 26, 2010

(65) Prior Publication Data
US 2011/0100973 A1    May 5, 2011

(30) Foreign Application Priority Data
Oct. 29, 2009    (KR) .................. 10-2009-0103683

(51) Int. Cl.
*F27D 11/00*    (2006.01)
*A21B 1/00*    (2006.01)
*A21B 1/22*    (2006.01)

(52) U.S. Cl. ...................... 219/385; 219/406
(58) Field of Classification Search .............. 219/385, 219/406
See application file for complete search history.

(56) References Cited

U.S. PATENT DOCUMENTS

| | | | |
|---|---|---|---|
| 3,971,876 A * | 7/1976 | Witkin et al. ............ | 219/413 |
| 6,331,212 B1 * | 12/2001 | Mezey, Sr. ............... | 118/725 |
| 2007/0215596 A1 * | 9/2007 | Wintenberger et al. ..... | 219/406 |

FOREIGN PATENT DOCUMENTS

| | | |
|---|---|---|
| JP | 2007-251126 | 9/2007 |
| KR | 10-2004-0054514 | 6/2004 |
| KR | 10-2005-0117120 | 12/2005 |
| KR | 10-2006-0064207 | 6/2006 |

* cited by examiner

*Primary Examiner* — David S Blum
(74) *Attorney, Agent, or Firm* — H.C. Park & Associates, PLC

(57) ABSTRACT

An apparatus for thermally processing a plurality of substrates including a process chamber into which a boat having a plurality of substrates stacked thereon is loaded, and a heater chamber separate from the process chamber and having a plurality of heaters to apply heat to the process chamber. Here, the heaters are installed to correspond to all sides of the plurality of substrates. Therefore, it is possible to minimize a temperature distribution in the process chamber and uniformly supply heat to the entire region of the plurality of substrates.

14 Claims, 2 Drawing Sheets

APPARATUS FOR THERMALLY PROCESSING SUBSTRATE

CROSS-REFERENCE TO RELATED APPLICATION

This application claims the benefit of Korean Patent Application No. 10-2009-0103683, filed Oct. 29, 2009, in the Korean Intellectual Property Office, the disclosure of which is incorporated herein by reference.

BACKGROUND

1. Field

Aspects of the present invention relate to an apparatus for thermally processing a substrate, and more particularly, to an apparatus for thermally processing a substrate capable of minimizing a temperature distribution in a process chamber and uniformly supplying heat to the entire region of the substrate.

2. Description of the Related Art

In recent times, techniques for manufacturing semiconductor devices and display devices have been developed to improve integrity, reliability, response time, etc., in order to meet with consumers' various needs. In general, semiconductor devices and display devices are manufactured by sequentially performing a series of unit processes such as deposition, photolithography, etching, ion implantation, diffusion, etc., on substrates.

Several of the unit processes may be performed in a substrate thermal processing apparatus such as a heating furnace. For example, a diffusion process, an annealing process, an oxidation process, a deposition process, etc., are performed in the substrate thermal processing apparatus.

The substrate thermal processing apparatus may generally be a vertical type furnace in which a quartz process chamber is installed in an inner space of a heater chamber, and substrates are processed in a high temperature atmosphere in the process chamber. The vertical type furnace employs a batch type furnace in which a plurality of substrates are received in a boat to be loaded into the process chamber at a time.

The heater chamber includes a plurality of heaters to evenly increase an inner temperature thereof. Here, the heaters are installed at sidewalls, a lower surface and an upper surface of the heater chamber. The heaters installed at the sidewalls of the heater chamber are disposed along an outer periphery of the heater chamber to surround the heater chamber in an elongated shape.

Since the heater has a circular shape whereas the substrates loaded into the process chamber have a rectangular shape, temperatures applied to sides and corners of the substrate may be different.

Since the heater chamber includes the heaters disposed in an elongated shape, it is impossible to heat only several regions according to the measured temperature distribution.

In addition, since the heater has an elongated shape, thermal expansion caused in proportion to its length may occur. Further, since the amounts of heat applied are different depending on positions of the rectangular substrate, the substrate may be deformed and the temperature distribution may be uneven.

Furthermore, if the temperature distribution is uneven, characteristics of the material formed on the substrate may be different depending on the positions thereof.

SUMMARY

Aspects of the present invention provide an apparatus for thermally processing a substrate capable of improving the structure of a heater applying heat to a process chamber, and minimizing a temperature distribution in the process chamber to uniformly supply heat to the entire region of a substrate.

According to an aspect of the present invention, an apparatus for thermally processing a substrate includes: a process chamber into which a boat having a plurality of rectangular substrates stacked thereon is loaded, and a heater chamber disposed outside the process chamber and having a plurality of heaters applying heat to the process chamber, wherein the plurality of heaters are installed to correspond to four sides and four corners of the substrate, respectively.

According to other embodiments of the present invention, distances from a periphery of the substrate to the heaters correspondingly installed at the four sides and four corners of the substrate may be equal to each other with respect to a center of the substrate.

According to another aspect of the present invention, the heaters may be divided in a longitudinal direction of the heater chamber.

According to another aspect of the present invention, the heaters may be elongated in a longitudinal direction of the heater chamber.

According to another aspect of the present invention, the apparatus may further include a temperature measurement part to measure a temperature in the process chamber. Here, the temperature measurement part may include detection sensors installed at an inner wall of the process chamber, and a control unit connected to the detection sensors and controlling operations of the heaters.

According to another aspect of the present invention, the temperature measurement part may further include a display part connected to the control unit to display the temperature of the process chamber measured by the detection sensors.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
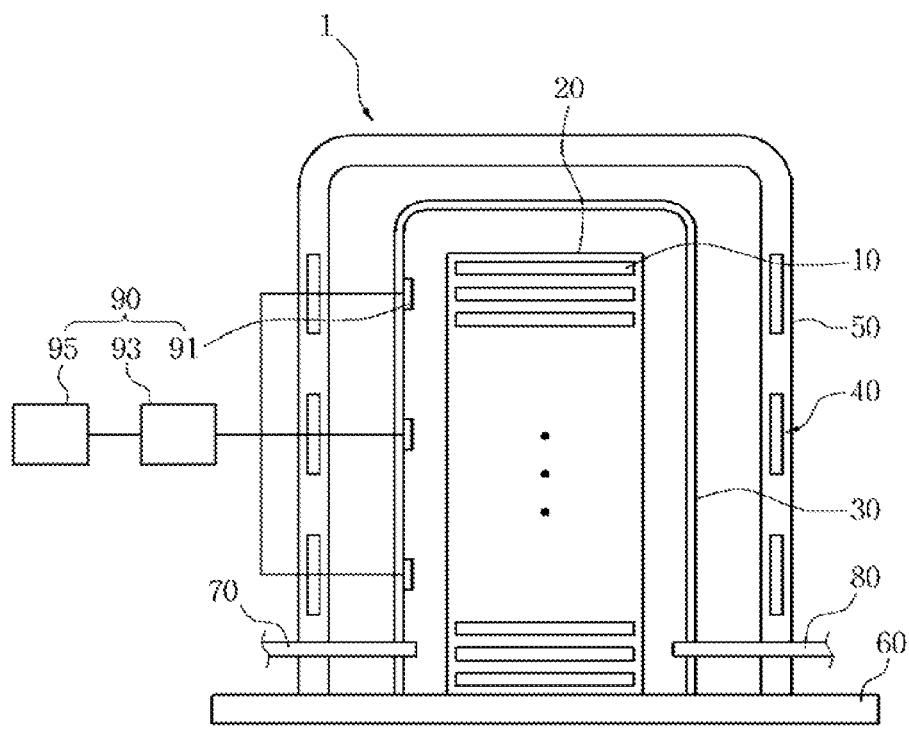
FIG. 1 is a schematic view showing the configuration of an apparatus for thermally processing a substrate in accordance with an exemplary embodiment of the present invention.

The present invention will now be described more fully hereinafter with reference to the accompanying drawings, in which exemplary embodiments of the invention are shown. Like numerals denote the like elements throughout the specifications, and when one part is "connected" with another part, these parts may be "directly connected" with each other, or "electrically connected" with each other having a third device therebetween. Moreover, in the drawings, thickness of layers and regions are exaggerated from clarity. Reference will now be made in detail to the present embodiments of the present invention, examples of which are illustrated in the accompanying drawings, wherein like reference numerals refer to the like elements throughout. The embodiments are described below in order to explain the aspects of the present invention by referring to the figures.

Figure 2:
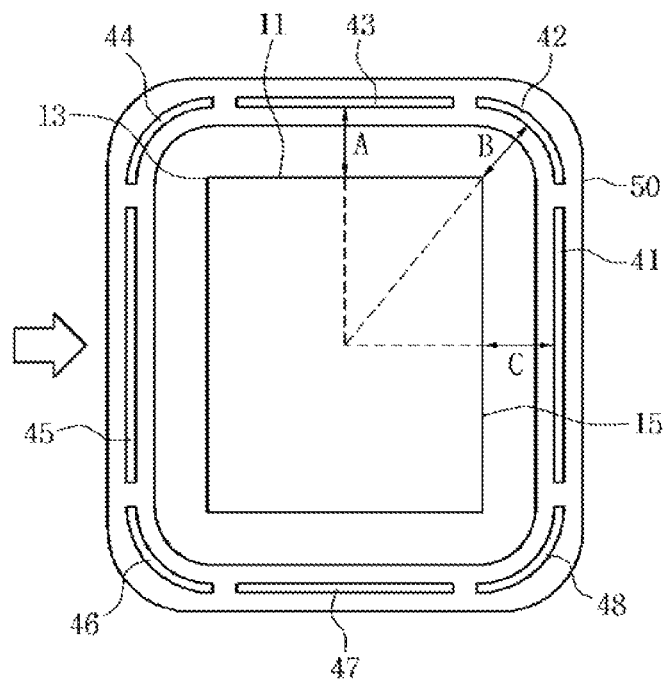
FIG. 2 is a schematic view for explaining a correlation between a substrate and heaters.
Figure 3:
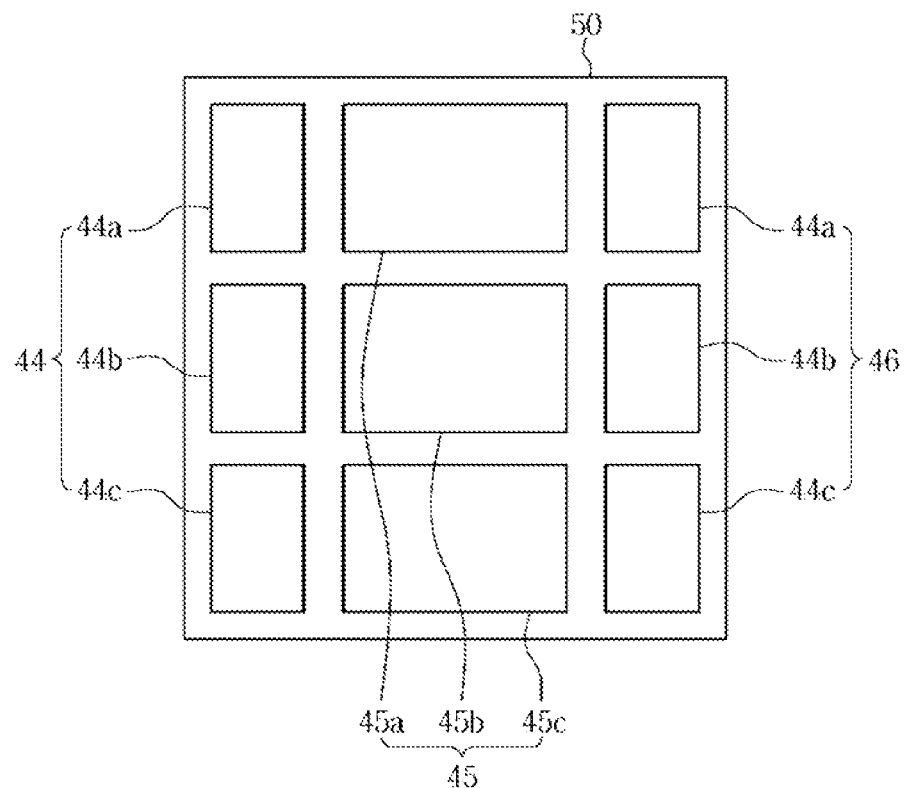
FIG. 3 is a view showing the configuration of heaters when viewed from an arrow direction of FIG. 2.
Figure 4:
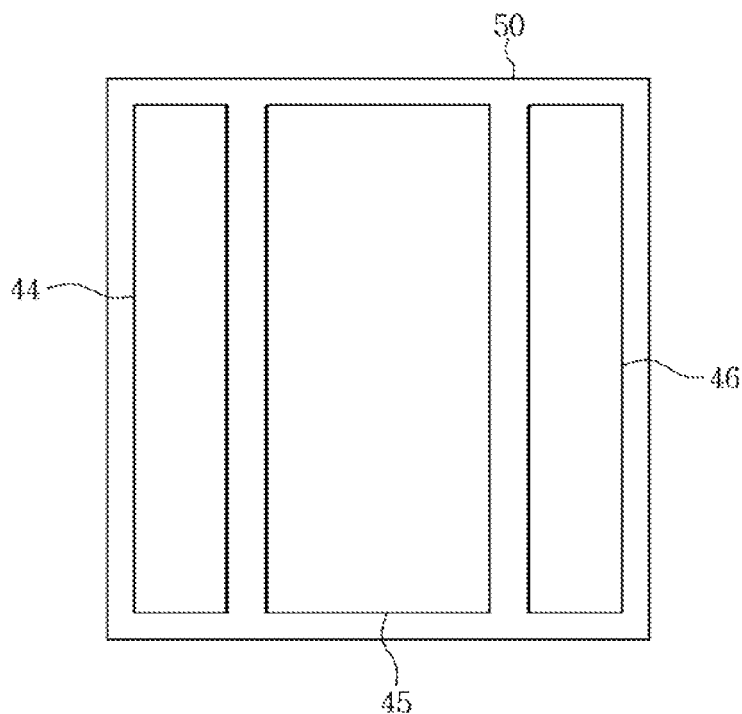
FIG. 4 is a view showing another configuration of heaters when viewed from an arrow direction of FIG. 2.

FIG. 1 is a schematic view showing the configuration of an apparatus for thermally processing a substrate in accordance with an exemplary embodiment of the present invention, FIG. 2 is a schematic view for explaining a correlation between a substrate and heaters, FIG. 3 is a view showing the configuration of heaters when viewed from an arrow direction of FIG. 2, and FIG. 4 is a view showing another configuration of heaters when viewed from an arrow direction of FIG. 2.

Referring to FIG. 1, an apparatus 1 for thermally processing a substrate in accordance with an exemplary embodiment of the present invention includes a process chamber 30 into which a boat 20 having a plurality of substrates 10 stacked thereon is inserted, and a heater chamber 50 installed outside the process chamber 30 to apply heat to the process chamber 30. The substrates 10 are thermally processed by heat applied to the process chamber 30. Here, the substrates 10 have a rectangular shape.

In addition, the substrate thermal processing apparatus 1 includes a base plate 60 supporting the boat 20. The base plate 60 may be configured to vertically move to load/unload the boat 20 mounted thereon into/from the process chamber 30. Here, the base plate 60 encloses the process chamber 30.

Further, the substrate thermal processing apparatus 1 includes a gas inlet port 70 connected to a gas supply source (not shown) to inject a process gas into the process chamber 30, and a gas outlet port 80 connected to a vacuum pump (not shown) to exhaust the process chamber 30 and discharge byproducts and residual gases to the exterior. The gas inlet port 70 and the gas outlet port 80 pass through the process chamber 30 and the heater chamber 50.

Of course, the base plate 60, the gas inlet port 70 and the gas outlet port 80 are not limited to the embodiment but may be variously modified according to process environments by those skilled in the art.

Furthermore, the substrate thermal processing apparatus 1 includes a temperature measurement part 90 for measuring a temperature in the process chamber 30. The temperature measurement part 90 includes detection sensors 91 installed at an inner wall of the process chamber 30 to detect a temperature in the process chamber 30 to output as an electrical signal, and a control unit 93 connected to the detection sensors 91 to control an operation of the heaters 40 in response to the electrical signal.

The detection sensors 91 may be installed at an upper part, a center part and/or a lower part of the process chamber 30 to precisely detect the temperature in the process chamber 30.

While the embodiment illustrates the temperature measurement part 90 installed at the inner wall of the process chamber 30 and constituted by the detection sensors 91 and the control unit 93, the temperature measurement part 90 is not limited to the embodiment but may be variously modified depending on process environments by those skilled in the art.

In addition, the temperature measurement part 90 may further include a display part 95 connected to the control unit 93 to display the temperature of the process chamber 30 measured by the detection sensors 91.

The boat 20 is formed of, mainly, quartz, and has a plurality of slots (not shown) in which the substrates 10 are stacked.

The process chamber 30 is formed of, generally, quartz, and has a tubular shape such that the boat 20 can be loaded into the process chamber 30 to thermally process the substrates 10.

The heaters 40 are installed in the heater chamber 50 to supply heat into the process chamber 30 to increase the temperature in the process chamber 30, thereby heating the substrates 10.

While the embodiment illustrates the heaters 40 installed in the heater chamber 50, the heaters 40 are not limited thereto but may be installed at an inner wall of the heater chamber 50.

Referring to FIG. 2, the heaters 40 are divided to correspond to four sides and four corners of the substrate 10. That is, the heaters 40 are constituted by heaters 41 to 48 disposed at eight regions, respectively. Here, distances A, B and C from the four sides and four corners of the substrate 10 to the heaters 40 correspondingly installed are equal to each other with reference to a center point of the substrate 10.

That is, the distance A between short sides 11 of the substrate 10 and the heaters 43 and 47 corresponding thereto, the distance B between corners 13 of the substrate 10 and the heaters 42, 44, 46 and 48 corresponding thereto, and the distance C between long sides 15 of the substrate 10 and the heaters 41 and 45 corresponding thereto are equal to each other with reference to the center point of the substrate 10.

Referring to FIG. 3, the divided heaters 44 to 46 may be divided in a longitudinal direction of the heater chamber 50. While the embodiment illustrates the heaters 44, 45 and 46 divided into 44a to 44c, 45a to 45c and 46a to 46c and installed at the upper part, the center part and the lower part of the heater chamber 50, respectively, the heaters are not limited thereto but may be divided into two or four sections. Similarly, other heaters 41, 42, 43, 47 and 48 may also be divided.

Referring to FIG. 4, the divided heaters 44 to 46 may be elongated in a longitudinal direction of the heater chamber 50. Similarly, other heaters 41, 42, 43, 47 and 48 may also be elongated in the longitudinal direction of the heater chamber 50.

Therefore, as in the embodiment, since the heaters 40 are divided into the heaters 41 to 48 corresponding to the four sides and four corners of the substrate 10 and the distances between the heaters 40 and the regions of the substrate 10 are equal to each other, it is possible to evenly supply heat to the entire region of the substrate 10.

In addition, in this embodiment, when the heaters 41 to 48 are divided in the longitudinal direction of the heater chamber 50, even though the temperature distributions are different in the longitudinal direction of the heater chamber 50, it is possible to divide and control the heaters to evenly supply heat to the heater chamber 50.

As can be seen from the foregoing, since distances from a periphery of a substrate 10 to the heaters 40 correspondingly disposed with respect to the substrate 10 are equal to each other, it is possible to evenly supply heat to the entire region of the substrate 10.

In addition, since the heaters 40 are divided in a longitudinal direction of a heater chamber 50, when a temperature distribution in the longitudinal direction of the heater chamber 50 occurs, the heaters 40 can be individually controlled to evenly supply heat, minimizing the temperature distribution.

Although the present invention has been described with reference to predetermined exemplary embodiments thereof, it will be understood by those skilled in the art that a variety of modifications and variations may be made to the present invention without departing from the spirit or scope of the present invention defined in the appended claims and their equivalents.

What is claimed is:

1. An apparatus for thermally processing a plurality of substrates, comprising:
   a process chamber configured to receive a boat having a plurality of stacked substrates; and
   a heater chamber enclosing the process chamber, the heater chamber comprising a plurality of heaters to apply heat to the process chamber, the plurality of heaters being disposed to correspond to all sides of the plurality of substrates,
   wherein the plurality of substrates have a rectangular shape comprising four sides and four corners, and distances from peripheries of the substrates to the plurality of heaters are equal to each other with respect to a center of each one of the plurality of substrates,
   wherein the process chamber has a tubular shape, and
   wherein at least one of the plurality of heaters located on edges of the process chamber have a semicircular shape and a remaining plurality of heaters located on sides of the process chamber have a rectangular shape.

2. The apparatus of claim 1, wherein distances from a periphery of each one of the plurality of substrates to each one of the plurality of heaters disposed corresponding to all sides of the plurality of substrates are equal to each other with respect to a center of each one of the plurality substrates.

3. The apparatus of claim 1, wherein the plurality of heaters are divided in a longitudinal direction of the heater chamber.

4. The apparatus of claim 3, wherein the plurality of heaters are installed at an upper part, a center part and a lower part of the heater chamber.

5. The apparatus of claim 1, wherein the plurality of heaters are elongated in a longitudinal direction of the heater chamber.

6. The apparatus of claim 1, further comprising a temperature measurement part to measure a temperature in the process chamber,
   wherein the temperature measurement part comprises detection sensors disposed on an inner wall of the process chamber and a control unit connected to the detection sensors and controlling operations of the plurality of heaters.

7. The apparatus of claim 6, wherein the temperature measurement part further comprises a display part connected to the control unit to display the temperature of the process chamber measured by the detection sensors.

8. The apparatus of claim 6, wherein the detection sensors are installed at an upper part, a center part, and a lower part of the process chamber.

9. The apparatus of claim 1, wherein the plurality of heaters are disposed in the heater chamber or on an inner wall of the heater chamber.

10. The apparatus of claim 1, wherein the plurality of heaters are grouped to correspond to the four sides and the four corners of the plurality of substrates.

11. An apparatus for thermally processing a plurality of substrates, the apparatus comprising:
    a heater chamber comprising a plurality of heaters disposed thereon; and
    a process chamber configured to receive a boat having a plurality of substrates placed inside the heater chamber, wherein distances between a periphery of each one of the plurality of substrates and a periphery of each one of the plurality of heaters disposed on the heater chamber is equal with respect to a center of each one of the plurality of substrates,
    wherein the plurality of substrates have a rectangular shape comprising four sides and four corners, and
    wherein the process chamber has a tubular shape, the heaters located on edges of the process chamber have a semicircular shape, and the heaters located on sides of the process chamber have a rectangular shape.

12. The apparatus of claim 11, wherein the plurality of heaters are divided in a longitudinal direction of the heater chamber.

13. The apparatus of claim 11, wherein the plurality of heaters are disposed on an upper part, a center part, and a lower part of the heater chamber.

14. The apparatus of claim 11, wherein the plurality of heaters are elongated in a longitudinal direction of the heater chamber.

* * * * *